United States Patent [19]

Boschetti et al.

[11] 4,348,664

[45] Sep. 7, 1982

[54] DEVICE FOR MEASURING ULTRAVIOLET LIGHT EXPOSURE

[75] Inventors: Armando Boschetti, Bryan, Ohio; David J. Snoek, Grand Rapids, Mich.

[73] Assignee: Elder Pharmaceuticals, Inc., Hamilton, Ind.

[21] Appl. No.: 97,500

[22] Filed: Nov. 26, 1979

Related U.S. Application Data

[63] Continuation-in-part of Ser. No. 956,202, Oct. 30, 1978, Pat. No. 4,279,254.

[51] Int. Cl.³ ............................................. G08B 21/00
[52] U.S. Cl. ............................. 340/600; 128/207.21; 250/372; 340/309.1; 340/573
[58] Field of Search ........... 340/600, 573, 540, 309.1; 128/207.21; 250/372

[56] References Cited

U.S. PATENT DOCUMENTS

| | | | |
|---|---|---|---|
| 3,290,669 | 12/1966 | Mews | 340/540 |
| 3,710,115 | 1/1973 | Jubb | 250/372 |
| 3,838,282 | 9/1974 | Harris | 250/372 |
| 3,891,849 | 6/1975 | Felice et al. | 250/372 |
| 4,010,372 | 3/1977 | Adler et al. | 250/372 |
| 4,229,733 | 10/1980 | Tulenko et al. | 250/372 |

FOREIGN PATENT DOCUMENTS

1001818  8/1965  United Kingdom .
1195029  6/1970  United Kingdom .

Primary Examiner—Glen R. Swann, III
Attorney, Agent, or Firm—Gordon W. Hueschen

[57] ABSTRACT

An apparatus designed for monitoring the administering of ultraviolet therapy, particularly for portable use such as at the beach, has a control system adapted to monitor the instantaneous intensity of the ultraviolet light received by a subject being treated, wherein the instantaneous intensity is integrated by means of a rechargeable electrochemical cell to measure the total ultraviolet energy per unit area received by the subject during a given time. The apparatus is so controlled that when the total energy received by the subject as measured by the apparatus reaches a predetermined preset value as determined by the discharged state of the electrochemical cell, a warning signal either visible or audible is given to the subject. In an improved embodiment an electronic means is used to subtract the energy measured at one wavelength from the energy measured at other wavelengths, thereby providing a low cost filter means for selecting the desired wavelength to be measured.

10 Claims, 2 Drawing Figures

DEVICE FOR MEASURING ULTRAVIOLET LIGHT EXPOSURE

This application is a continuation-in-part of our prior-filed copending application Ser. No. 956,202, filed Oct. 30, 1978, now U.S. Pat. No. 4,279,254.

BACKGROUND OF THE INVENTION

Field of the Invention

The present invention relates to devices for measuring the amount of ultraviolet light used in treating a subject, and is more particularly concerned with a device for monitoring the total amount of ultraviolet light energy applied to the subject during a period of time during which the intensity of the energy may vary, and to sound a warning either audible or visible to warn the subject that the predetermined amount of energy has been applied to him.

Description of the Prior Art

Ultraviolet light therapy utilizing light either from the sun or from ultraviolet lamps has long been used both for applying a tan to the skin of a subject and for treating the skin of the subject for certain diseases for which ultraviolet light has therapeutic value. In order to control the total amount of ultraviolet light energy received by the subject, a standard timer has been conventionally used which, after a predetermined period, provides an alarm, turns off the lamps, or both.

More recently it has been found that the physiological effect of ultraviolet light may be greatly accelerated if the subject is first administered certain drugs prior to the ultraviolet light exposure. The drugs are administered either topically or internally. This prior treatment permits a given degree of physiological treatment to be applied in a far shorter time that when ultraviolet light is applied in the absence of such drugs. Among such drugs are those developed for treating psoriasis. Among these drugs is Psoralen, manufactured and marketed by the Paul B. Elder Company. When the subject is thus first sensitized, it is extremely important in administering ultraviolet radiation that the amount of radiation energy received by the subject be very carefully controlled within certain limits to prevent over exposure and its attendant injury. The use of timers alone may not provide the necessary precision of total ultraviolet light energy measurement, since the intensity of sunlight may vary with increased or decreased cloud coverage, and time of day. The intensity of light produced by ultraviolet lamps may vary with the age of the lamps and with changes in the voltage of the electrical main.

SUMMARY OF THE INVENTION

It is accordingly an object of the invention to provide an apparatus which accurately measures the intensity of ultraviolet produced either by the sun or ultraviolet lamps.

It is additionally an object of the invention to provide a means for continually measuring the instantaneous amount of ultraviolet light power received over a unit area of the skin of a patient, to integrate the total energy radiation received, and to sound or display an alarm or turn the ultraviolet lamps off automatically after a preset amount of radiation energy has been received.

It is still an additional object to provide means for presetting the actual amount of total radiation energy desired.

These and other objects, advantages and functions of the invention will be apparent upon reference to the specification and to the attached drawings illustrating the preferred embodiments of the invention, in which like parts are identified by like reference symbols in each of the views.

According to the invention an ultraviolet radiation measuring apparatus is provided having a power supply means, an ultraviolet light sensor which is sensitive to the desired ultraviolet light spectrum for measuring the instantaneous intensity of the ultraviolet light being applied, electrochemical means for integrating the light intensity, and means for presetting the electrochemical cell so that it will result in actuating a signal when a predetermined amount of ultraviolet radiation energy has been applied per unit area. In an improved embodiment the ultraviolet energy sensor is so designed that it is sensitive only to a limited spectrum of ultraviolet light, and further may be designed to measure the cosine directed value of power.

DESCRIPTION OF THE PREFERRED EMBODIMENT

Figure 1:
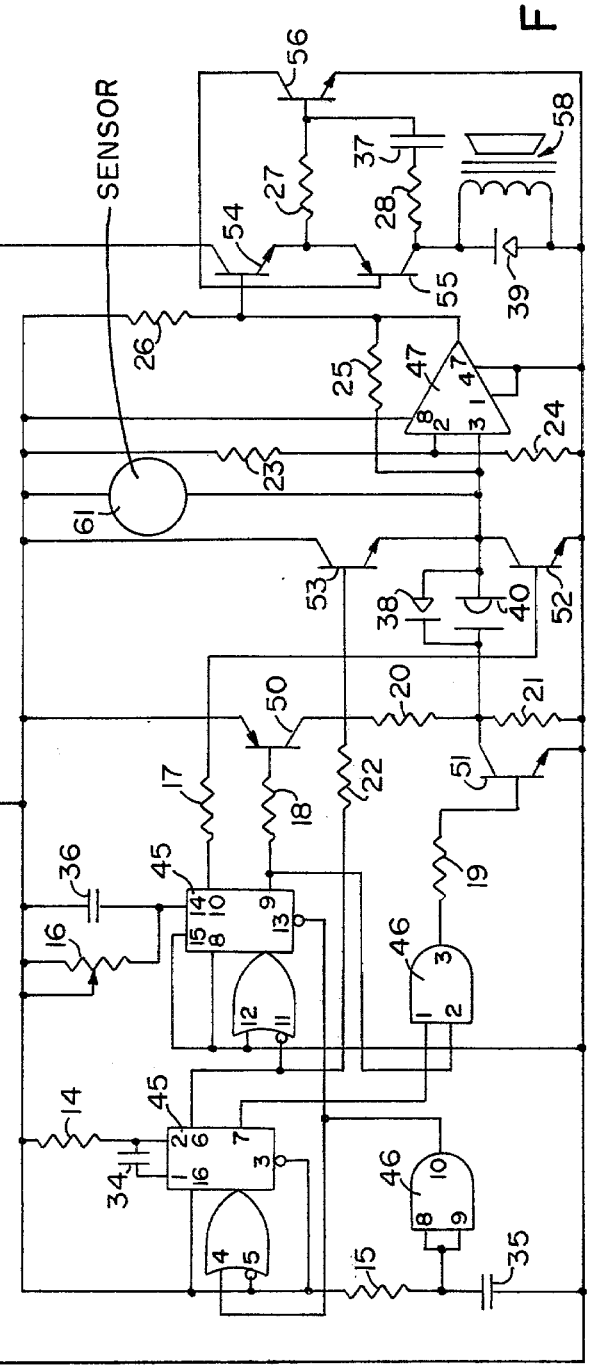
FIG. 1 is a schematic electrical diagram showing the photoelectric cell, electrochemical cell, and associated circuitry.

Referring to FIG. 1, an electrical diagram of the present invention is shown and comprises a battery 10, a switch 11, and resistors 12-28. Of the resistors 16 is a potentiometer, and the remainder are fixed resistors.

The circuit further comprises capacitors 33-37, and diodes 38 and 39. An E cell 40 is utilized to accumulate the energy of ultraviolet radiation.

The circuit further comprises a voltage regulator integrated circuit 44, a monostable multiple multivibrator integrated circuit 45, a quad "AND" gate integrated circuit 46, and a comparator integrated circuit 47.

The circuit further includes PNP transistors 50 and 55, and NPN transistors 51, 52, 53, 54, and 56.

The basic component of the present circuit is a device called an "E" cell 40. It is in effect a minature electrochemical cell or plating circuit, consisting of a gold electrode, a silver electrode and an electrolyte containing silver ions. In the set mode or condition in which the circuit is calibrated to time out after a certain amount of ultraviolet energy has been measured, silver atoms are electroplated on the gold electrode, one atom for each electron of current. In the clearing mode or operational mode, current flow is reversed and silver atoms are taken off the gold anode and transferred to the solution and to the silver electrode. When no more silver atoms remain of the gold electrode, the voltage across the electrode rises.

In the present circuit, the "E" cell 40 is first cleared to make sure all atoms of silver are removed from the gold electrode. The cell is them "Set" or electroplated with silver ions at a relatively high current (18 mA) for a short period of time (0-5 sec.). When the proper amount of silver ions have been plated on the gold electrode, transistors switch the cell to the clearing or operating mode. The sensor is a photoresistive device and passes a current proportional to the amount of UVB radiation it senses. This currect clears the cell, (removes silver ions from the gold electrode) in a time inversely proportional to the UVB radiation intensity and directly proportional to the set time. When the "E" cell completely clears the silver ions from the gold electrode, its voltage rise is sensed by the apparatus and an alarm sounds.

In placing the present device in operation, the operator sets the resistor 16 which is a potentiometer having a calibrated dial to a number corresponding to the skin type of the subject as recommended by a chart provided with the device. He then turns on the switch 11. Power from the battery 10 (9 V alkaline preferred) is supplied to voltage regulator 44 and to the oscillator switching transistor 54. An R-C combination resistor 15 and capacitor 35 holds pins 8 and 9 of the IC 46 low until power has stabilized. When the capacitor 35 is charged to about 3 volts, pin 10 of the integrated circuit 46 goes high, triping the monostable 45. Pin 6 of monostable 45 goes high while pin 7 goes low. Voltage at pin 6 turns on transistor 53, clearing the E cell 40 through resistor 21. Pin 6 stays high for about 3 seconds, then goes low and pin 7 goes high. As pin 6 drops low, the second half of the integrated circuit 45 trips, and pin 10 goes high and pin 9 goes low. Voltage at pin 10 turns on the transistor 52, low voltage at pin 9 turns on the transistor 50 for a period of time determined by the time of the setting of the resistor 16, corresponding to the skin type of the user. Transistor 50 and transistor 52 set the "E" cell through the resistor 20. When both halves of the integrated circuit 45 have timed out, both pins 1 and 2 of integrated circuit 46 will be high. Pin 3 of integrated circuit 46 will also be high and transistor 51 will be on, providing a current path through the "E" cell for the sensor current which clears the E cell at a rate determined by the amount of intensity of UVB radiation (320–290 NM) falling on the sensor.

When the "E" cell has completely cleared the silver from the gold andode, the voltage at pin 3 of integrated circuit 47 rises above the 0.3 V at pin 2 of integrated circuit 47, turning the integrated circuit 47 on. The resistor 25 insures that the integrated circuit 47 stays on. As pin 7 of integrated circuit 47 goes high, the transistor 54 turns on supplying power to the oscillator comprised of resistors 27 and 28, capacitor 37, and transistors 55 and 56. These components comprise an oscillator circuit which drives a transducer or loud speaker 58 to produce a beep or oscillating sound.

Although any of a number of off-the-shelf components may be utilized in assembling the present apparatus, the following is a list of the actual components and their commercial designations which were actually utilized:

| Numerical Designation | Component | Value or Designation |
| --- | --- | --- |
| 11 | Switch | SPST |
| 58 | Audio Transducer | Panasonic EAF-12R01A |
| 62 | Schott Filter | UG11 |
| 65 | Filter Glass | Corning 9782 |
| 67 | Diffuser | .015" Thick Teflon |
| 64 | Mylar Film, matte on one surface | Having film on magnesium tunstate on matte surface |
| 66 | Photocell (photo-conductive) | VACTEC VT523L |
| 33 | Tantalum Capacitor | 33 µf |
| 34 | Tantalum Capacitor | 10 µf |
| 35 | Tantalum Capacitor | 4.7 µf |
| 36 | Tantalum Capacitor | 10 µf |
| 37 | Disc Capacitor | .0047 µf |
| 38 & 39 | General Purpose Silicon Diodes | IN4148 |
| 40 | "E" Cell | Plessey Electro-Products 570 |
| 44 | Voltage Regulator | IC (Integrated Circuit) |
| 45 | Monostable Multi-vibrator | 4538 |
| 46 | Quad "AND" Integrated Circuit | 4081 |
| 47 | Comparator Integrated Circuit | 311 |
| 50 & 55 | PNP Transistors | General Purpose 2 mf 4402 |
| 51,52,53 | NPN Transistors | General Purpose 2N4400 |
| 12 | Resistor | 1K |
| 13 | Resistor | 4.7K |
| 14 | Resistor | 330K |
| 15 & 25 | Resistors | 100K |
| 16 | Potentiometer | Cermet 100K |
| 17,18 & 19 | Resistors | 10K |
| 20,21,22,26 & 28 | Resistors | 330 ohms |
| 23 | Resistor | 1 megohm |
| 24 | Resistor | 50K |
| 27 | Resistor | 300K |

Figure 2:
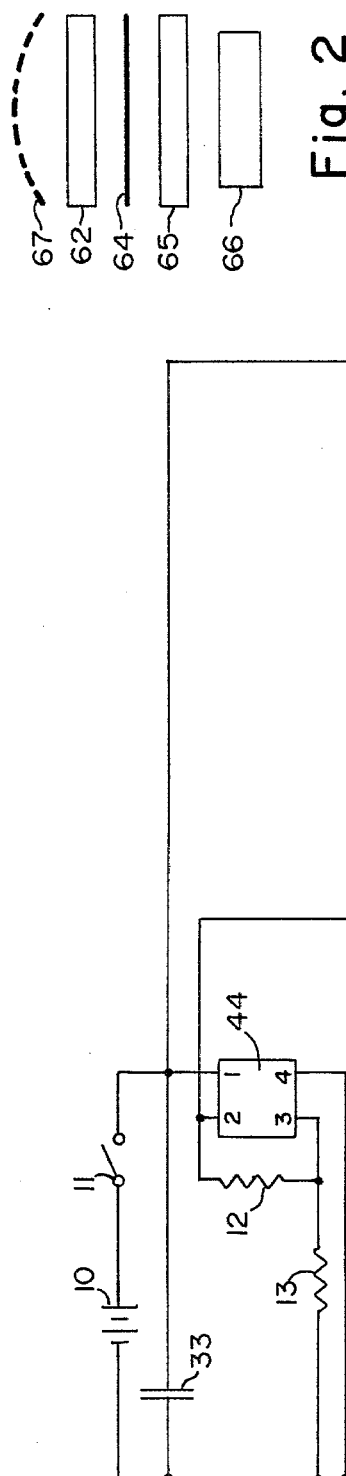
FIG. 2 is an exploded elevational view of the ultraviolet light sensor apparatus.

Referring to FIG. 2, an ultraviolet light sensor 61 is shown comprising a Schott UG11 filter 62, a Mylar (polyester) film 64, a Corning 9782 blue filter 65, a photocell 66, VACTAC VT523L, and a teflon diffuser 67.

Light entering the sensor passes through the Schott filter 62, which absorbs visible radiation and transmits 290–410 NM ultraviolet light and some infra-red light. UVB, 290–320 NM radiation excites a magnesium tungstate phosphor supported on the matte side of Mylar film 64. The phosphor fluoresces blue-green. This radiation is transitted by the Blue Corning 9782 filter 65. The flue filter absorbs stray UV radiation and the infra-red radiation. The blue light falls on the photocell 66 which changes the resistance of the photocell and permits current to flow through the photocell and the "E" cell 40.

To convert the sensor into a cosine sensor to simulate the position of the human skin of the subject, a teflon diffuser 67 is utilized. A sheet of 0.015" thick teflon is easily formed into a hemisphere and is placed over the UG11 filter 62. The radius of the sphere should be such that the photocell is positioned at its center. The photocell sensitivity peaks in the green region of the spectrum.

When the diffuser 67 is utilized, the sensor 61 should be oriented along a line perpendicular to the skin surface of the subject. If the diffuser 67 is not used, the sensor 61 must be pointed at the sun.

In selecting the components for the present circuit, several considerations were taken into account. First, the capacitor 33 was utilized to absorb current surges caused by the oscillator. Resistors 12 and 13 were chosen to set the proper voltage output value for the regulator 41. A Cermet potentiometer was chosen for the resistor 16 in order to assure stability in the setting of the total ultraviolet energy to be applied to the subject. The diode 38 was chosen to limit the voltage drop across the "E" cell 40, and the diode 39 was chosen to limit the spikes which might be applied to the terminals of the transducer 58.

The regulator 44 is utilized because a good reference voltage is needed at the emitter of the transistor 50 so that the setting current for the "E" cell 40 is repeatable. Stable voltage is also required for the high side of the sensor and the resistor 23, the comparator trip point reference. None of the other components requires an extremely stable voltage source. The voltage regulator 44 might be eliminated by the use of Zener Diodes if proper measures are taken to prevent possible voltage spikes from the oscillator from tripping the monostable multivibrators. In the present circuit the regulator 44 blocks any such possible spikes.

The operation of the present apparatus is based on a commercially available device called an "E" cell 40. The cell is an electrolytic plating device, comprising a gold electrode, a silver electrode, and an electrolyte providing silver ions. When the apparatus is placed in the set mode to prepare the cell for measuring a desired amount of ultraviolet energy, current is applied by the circuit in a measured amount and silver atoms are plated out on the gold electrode, one atom being deposited for each electron of current. In the clearing mode during operation of the device in measuring ultraviolet energy, the current flow is reversed by the device and positive current is now applied to the gold electrode to make it an anode and to deplate the silver which was deposited during the set period from the gold anode into the electrolyte and to the silver electrode which is now made the cathode. The rate of discharge is controlled by the sensor 61 which is a photoresistive device controlling the magnitude of the current flow which is applied to the "E" cell as a function of the ultraviolet light intensity applied to the cell. The intensity of radiation is integrated by the "E" cell 40.

When all the silver atoms have been depleted from the gold electrode, the voltage across the "E" cell 40 rises, and, as a result, the apparatus triggers the alarm sounded by the transducer or loudspeaker 58.

When the present device is first turned on by the switch 11, the circuit causes the E cell to be first cleared of any atoms of silver which might remain on the gold electrode and which would throw the entire system off calibration. The cell is then set or calibrated at a relatively high current (18 ma) for a short period of time (0–5 seconds). The transistors then switch the "E" cell to the operational clearing mode. The sensor 61 then permits a current to flow proportional to the intensity of the ultraviolet B radiation applied to it (1–10 micro amps). This current clears the cell by deplating silver atoms from the gold electrode in a time inversely proportional to the ultraviolet B radiation and proportional to the set time. When the "E" cell then clears, the voltage rise is sensed and the alarm sounds.

It is to be understood that the invention is not to be limited to the exact details of operation, structure, or circuitry shown and described in the specification and drawings, since obvious modifications and equivalents will be readily apparent to one skilled in the art.

What is claimed is:

1. An apparatus for rendering safer the application of ultraviolet light radiation to the skin of a subject, comprising means for precisely monitoring the total ultraviolet light radiation energy per unit area impinging upon the subject, and providing notification when a predetermined amount of energy per unit area has been applied to the subject, said apparatus comprising:
   (a) photoelectric means for providing an electrical signal proportional to the intensity of the ultraviolet light which impinges thereon,
   (b) rechargeable electrochemical means for integrating the signal from said photoelectric means, and means for recharging said electrochemical means to a state of charge corresponding to the total amount of ultraviolet light radiation that is desired to be applied per unit area upon the subject, and
   (c) means for providing notification when the total light energy received by the subject reaches predetermined value as determined by the discharged state of said electrochemical means.

2. An apparatus according to claim 1, wherein said electrochemical means is an E cell comprising a container, a gold electrode, a silver electrode, and an electrolyte containing silver ions.

3. An apparatus according to claim 2, having means for completely discharging said "E" cell prior to setting, said means being automatically actuated when said apparatus is turned on.

4. An apparatus according to claim 2, having means for automatically connecting said photoelectric sensor means for controlling the discharge of said "E" cell after said "E" cell has been charged to a predetermined value.

5. An apparatus according to claim 2, said recharging means having a potentiometer with a calibrated dial for setting the predetermined amount of silver to be plated out on the gold electrode of said "E" cell.

6. An apparatus according to claim 2, having means for completely discharging said "E" cell when said apparatus is turned on, means for charging said "E" cell to a precisely predetermined value after said "E" cell has been completely discharged, and means for automatically connecting said photoelectric sensor means in series with said "E" cell after said "E" cell has been charged to a predetermined value.

7. An apparatus according to claim 6, wherein said means for providing notification when the total light energy received by the subject reaches a predetermined value comprises means for sounding an audible alarm.

8. An apparatus according to claim 7, wherein means for sounding an audible an alarm is connected to said sensing means which comprises an oscillating circuit and a sound transducer operated by said oscillating circuit.

9. An apparatus according to claim 2, wherein said photoelectric sensor means comprises an ultraviolet filter, a polyester film coated with a magnesium tungstate phosphor on the matte side thereof, a blue filter and a photoresistive cell.

10. An apparatus according to claim 9, wherein a dome-shaped diffuser is mounted over said filter.

* * * * *

UNITED STATES PATENT AND TRADEMARK OFFICE
CERTIFICATE OF CORRECTION

PATENT NO. : 4,348,664

DATED : September 7, 1982

INVENTOR(S) : Armando Boschetti and David J. Snoek

It is certified that error appears in the above-identified patent and that said Letters Patent is hereby corrected as shown below:

Col. 1, line 6; "copening" should read -- copending --

Col. 1, line 36; "that" should read -- than --
Col. 2, line 58; "electrode" should read -- electrodes --
Col. 4, line 34; "transitted" should read -- transmitted --
Col. 4, line 35; "flue" should read -- blue --
Col. 4, line 57; "41." should read -- 44. --
Col. 5, line 30; "depleted" should read -- deplated --

Signed and Sealed this

Twenty-second Day of February 1983

[SEAL]

Attest:

GERALD J. MOSSINGHOFF

Attesting Officer    Commissioner of Patents and Trademarks